United States Patent
Wieck

(10) Patent No.: US 7,061,993 B2
(45) Date of Patent: Jun. 13, 2006

(54) CDMA RECEIVER ARCHITECTURE FOR LOWER BYPASS SWITCH POINT

(75) Inventor: Christopher Peter Wieck, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 848 days.

(21) Appl. No.: 09/942,360

(22) Filed: Aug. 29, 2001

(65) Prior Publication Data

US 2003/0081694 A1    May 1, 2003

(51) Int. Cl.
- H03K 9/00    (2006.01)
- H04L 27/06   (2006.01)
- H04L 27/14   (2006.01)
- H04L 27/22   (2006.01)

(52) U.S. Cl. .................. 375/316; 375/238; 375/239; 375/142; 375/256; 375/257; 375/286; 375/353; 329/304; 329/311; 455/130

(58) Field of Classification Search ................ 375/316; 330/51, 151, 10, 136; 455/126
See application file for complete search history.

(56) References Cited

U.S. PATENT DOCUMENTS

| | | | |
|---|---|---|---|
| 3,673,499 A | 6/1972 | Avins et al. | |
| 4,754,233 A | 6/1988 | Pickett | |
| 5,083,096 A | 1/1992 | Miyazaki | |
| 5,196,806 A | 3/1993 | Ichihara | |
| 5,216,379 A | 6/1993 | Hamley | |
| 5,278,997 A | 1/1994 | Martin | |
| 5,307,512 A | 4/1994 | Mitzlaff | |
| 5,438,683 A | 8/1995 | Durtler et al. | |
| 5,457,811 A | 10/1995 | Lemson | |
| 5,471,656 A | 11/1995 | Kusunoki | |
| 5,537,675 A | 7/1996 | Bond | |
| 5,570,065 A | 10/1996 | Eberhardt et al. | |
| 5,574,991 A | 11/1996 | Miyama et al. | |
| 5,586,146 A | 12/1996 | Fang et al. | |
| 5,589,796 A | 12/1996 | Alberth, Jr. et al. | |
| 5,696,467 A | 12/1997 | McPhilmy et al. | |
| 5,722,061 A * | 2/1998 | Hutchison et al. | ....... 455/245.1 |
| 5,724,005 A | 3/1998 | Chen et al. | |
| 5,854,973 A | 12/1998 | Holtvoeth | |
| 5,886,547 A | 3/1999 | Durec et al. | |
| 5,930,692 A | 7/1999 | Peterzell et al. | |
| 5,949,567 A | 9/1999 | Jebens | |
| 6,009,129 A * | 12/1999 | Kenney et al. | ............. 375/346 |

(Continued)

FOREIGN PATENT DOCUMENTS

WO    WO 9014718 A1 *   11/1990

*Primary Examiner*—Stephen Chin
*Assistant Examiner*—Erin M. File
(74) *Attorney, Agent, or Firm*—Thomas F. Lebens; Fitch, Even, Tabin & Flannery

(57) ABSTRACT

A bypass circuit around a filter and RF amplifier of a front end device is activated when a received signal strength (RSS) passes a threshold in which the filter and RF amplifier are not necessary to filter/boost the received signal for processing in subsequent electronics (mixers, SAW filters, AGC amps, etc). A control device compares the RSS to the threshold and activates the bypass circuit. The bypass circuit is a switch coupled between an input of the filter and an output of the RF amplifier. The RF amplifier is shutdown when the bypass circuit is activated. The present invention may be used in combination with an LNA bypass to further decrease power consumption.

19 Claims, 13 Drawing Sheets

U.S. PATENT DOCUMENTS

| | | |
|---|---|---|
| 6,052,572 A | 4/2000 | Imura |
| 6,118,989 A | 9/2000 | Abe et al. |
| 6,141,561 A | 10/2000 | Izumiyama |
| 6,175,279 B1 | 1/2001 | Ciccarelli et al. |
| 6,208,202 B1 * | 3/2001 | Kaufman et al. ............. 330/51 |
| 6,208,849 B1 | 3/2001 | Cho et al. |
| 6,271,722 B1 * | 8/2001 | Ballantyne ................... 330/51 |
| 6,313,698 B1 * | 11/2001 | Zhang et al. ................. 330/51 |
| 6,351,504 B1 * | 2/2002 | Igarashi et al. ............. 375/349 |
| 6,445,247 B1 * | 9/2002 | Walker ........................ 330/10 |
| 6,487,419 B1 * | 11/2002 | Freed ......................... 455/522 |
| 6,529,716 B1 * | 3/2003 | Eidson et al. ............. 455/115.1 |
| 6,668,028 B1 * | 12/2003 | Wieck ....................... 375/349 |
| 6,687,491 B1 * | 2/2004 | Wieck ..................... 455/234.1 |
| 2001/0028244 A1 * | 10/2001 | Bhat ........................ 324/76.35 |
| 2001/0034217 A1 * | 10/2001 | Loke et al. .................. 455/126 |
| 2003/0139161 A1 * | 7/2003 | Wieck ..................... 455/234.1 |
| 2004/0105511 A1 * | 6/2004 | Wieck ........................ 375/317 |

* cited by examiner

CDMA RECEIVER ARCHITECTURE FOR LOWER BYPASS SWITCH POINT

BACKGROUND OF THE INVENTION

1. Field of Invention

The present invention relates to power consumption of electronic equipment and maintaining linearity in amplifiers used in electronic circuits. The invention particularly relates to power consumption reduction and linearity requirements in mobile electronic devices such as CDMA communication devices.

2. Discussion of Background

There are presently multiple types of cellular radiotelephone systems operating. These systems include the advanced mobile phone system (AMPS) and the digital cellular systems including time division multiple access (TDMA) and code division multiple access (CDMA).

In cellular telephones and other communication devices, radio frequency (RF) amplifiers are typically used to amplify RF signals received by the devices. These RF amplifiers typically generate a gain of the received signal. One requirement is linear amplification is desired to prevent signal distortion. And, especially for mobile devices such as cellular telephones, due to the limited quantity of energy stored in the accompanying battery, efficiency is also a strong consideration.

However, efficiency and linearity are often competing considerations. One method for increasing efficiency is selecting an appropriate bias current for the transistor of the RF amplifier. When a low amplifier transistor bias current is chosen, battery life and talk time are increased. This generally results in acceptable distortion at low to moderate power levels, but creates unacceptable distortion at high power levels. When linearity is more important, a larger transistor bias current is chosen, reducing distortion to an acceptable level even at high power levels. The high bias current may also be required to obtain the maximum output power from the amplifier output transistor. However, the high bias current reduces battery life and talk time, particularly at low power levels.

Cellular radiotelephone systems operate by having multiple antennas covering a geographic area. The antennas radiate into an area referred to in the art as a cell. The AMPS cells are separate and distinct from the CDMA cells. This makes it likely that the antenna for one system's cell may be located in a cell of another system. Likewise, within a particular system (AMPS, CDMA, and TDMA), there are two service providers within a given area. These providers often choose to place cells in different geographical locations from their competitor, hence there are situations where a radiotelephone on system 'A' might be far away from the nearest system 'A' cell antenna while close to a system 'B' cell antenna. This situation means that the desired receive signal will be weak in the presence of strong multi-tone interference.

This intermixing of system antennas can cause problems for a mobile radiotelephone that is registered in one system, such as the CDMA system, and travels near another system's antenna, such as an AMPS antenna. In this case, the signals from the AMPS antenna can interfere with the CDMA signals being received by the radiotelephone due to the proximity of the radiotelephone with the AMPS cell or the higher power of the AMPS forward link signal.

The multi-tone interference encountered by the radiotelephone from the AMPS signals or other digital system creates distortion products or spurs. If these spurs fall in the band used by the radiotelephone, they can degrade receiver and demodulator performance. One way in which degradation occurs is the additional stress placed on RF amplifiers and mixers used in the RF chain that processes received signals.

RF chain electronics are similarly stressed when nearby systems are unintentionally 'jammed' the competitor system unintentionally. The goal of the cellular carrier is to provide a high signal to noise ratio for all the users of their system by placing cells close to the ground, or near their users, and to optimize coverage with the minimum number of cells resulting is so called "strong cells." Unfortunately, this technique provides for better signal quality for the carrier's system at the expense of interfering with the competitor's system. The amplification of 'jamming' signals causes additional power drain.

SUMMARY OF THE INVENTION

The present inventor has realized the need to reduce power drain caused by the amplification of signals received in cellular telephone devices. Although particularly well suited to use in radiotelephones, the invention may be practiced in any device that amplifies signals using similar parts as described further herein. In one embodiment, the present invention provides a front end architecture, comprising, a Low Noise Amplifier (LNA) having an LNA input and an LNA output, said LNA input coupled to a signal source, a filter having an input coupled to the LNA output and a filter output, an amplifier having an amplifier input coupled to the filter output and an amplifier output, a bypass circuit coupled between the input of the filter and the amplifier output and configured to bypass the filter and amplifier, and a control device configured to activate and deactivate said bypass circuit.

The present invention may also be embodied as a front end device, comprising, means for measuring a received signal strength (RSS), means for comparing the received signal strength to a predetermined threshold, and means for bypassing a filter and an amplifier in the front end if the received signal strength is greater than said threshold.

The present invention includes a method of reducing power requirement of a front end device in a receiver, comprising the steps of, measuring a received signal strength (RSS), comparing the received signal strength to a predetermined threshold, and bypassing a filter and an amplifier in the front end if the received signal strength is greater than said threshold.

Both the device and method may be conveniently implemented in programming on a general purpose computer, or networked computers, and the results may be displayed on an output device connected to any of the general purpose, networked computers, or transmitted to a remote device for output or display. In addition, any components of the present invention represented in a computer program, data sequences, and/or control signals may be embodied as an electronic signal broadcast (or transmitted) at any frequency in any medium including, but not limited to, wireless broadcasts, and transmissions over copper wire(s), fiber optic cable(s), and co-ax cable(s), etc.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Before proceeding with the particulars of the present invention, a more detailed recitation of the observed qualities in current receiver devices is necessary to provide a better understanding of the problems addressed by the present invention. In that light, consider the CDMA receiver which has some extraordinarily tough specifications to meet in terms of sensitivity and linearity requirements.

A common solution to increase linearity is to increase the bias current to the receiver amplifiers. Another solution is to bypass amplifiers when input signals exceed a threshold in which the signals can be processed without amplification from the bypassed amplifier. The bypassed amplifiers may be an LNA, low noise amplifier, or an RF, radio frequency, amplifier in a receiver front end.

Figure 1A:
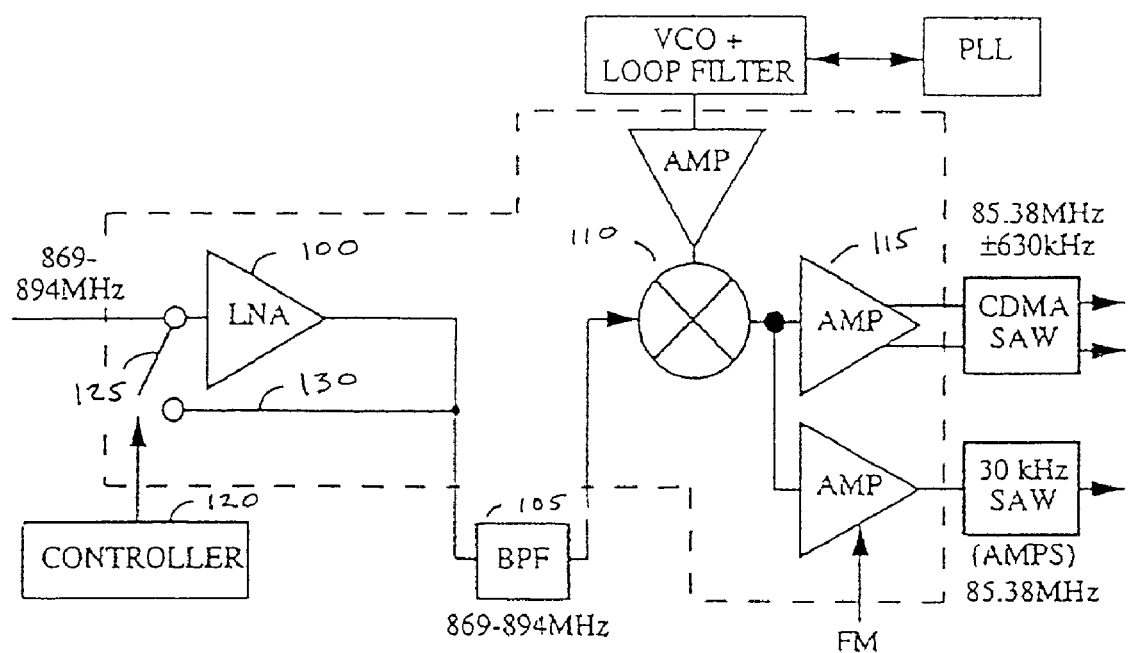
FIG. 1A is a block diagram of a conventional LNA bypass in a receiver front end.

Referring now to the drawings, wherein like reference numerals designate identical or corresponding parts, and more particularly to FIG. 1A thereof, there is illustrated a block diagram of a conventional LNA bypass in a receiver front end. The receiver front end includes an LNA 100, Band Pass Filter (BPF) 105, mixer 110, and amplifier 115. The LNA 100 maximizes the receiver's sensitivity to weak signals. The LNA 100 can be bypassed using controller 120 that closes a switch 125 that activate bypass path 130. When bypassed, the LNA power may be shutdown. An example of LNA bypass is described in *Hutchinson IV* et al., entitled "Method And Apparatus For Increasing Receiver Immunity To Interference," U.S. Pat. No. 5,722,061, the contents of which are incorporated herein by reference in their entirety.

However, LNA bypass often operates at the expense of undesired loading which could worsen the noise figure. The LNA's gain raises the signal above the following stage's thermal noise floor, so that the noise figure of the following stages is not nearly as critical to the overall sensitivity of the receiver. When bypassed, the signal will not be above the noise floor of subsequent stages until a much higher level, so that the bypass point, as measured by receive signal strength (RSSI), is much higher than the sensitivity with the LNA engaged.

Figure 1B:
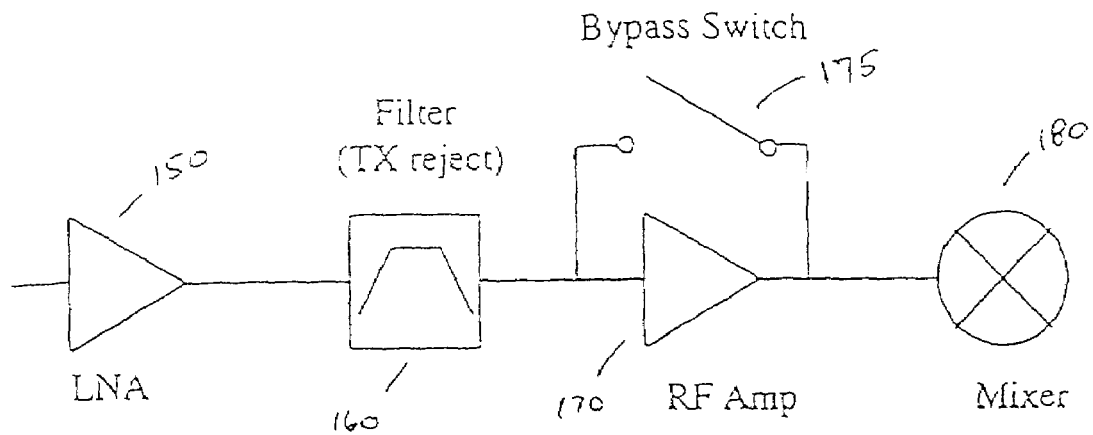
FIG. 1B is a block diagram of a conventional receiver front end.

FIG. 1B shows a receiver front end including an LNA 150, Filter 160, RF amplifier 170, mixer 180, and bypass switch 175. The front end of FIG. 1B illustrates a more desirable bypassing architecture. In this case the second amplifier, RF amplifier 170 is bypassed using the bypass switch 175. The advantages for this scenario are that the bypass point can be lower than the LNA bypass arrangement in FIG. 1A because the LNA's gain (LNA 150) remains engaged to raise the signal above the thermal noise floor.

The RF Amp might be expected to experience stronger signals than does the LNA since they are amplified first. However, particularly in a receiver/transmitter device in which TX signals are also generated by a device also having the RX front end, in the case of the leakage from the transmitter (TX), it depends on the rejection, at the transmit frequency, of the preceding filter. Typically this rejection is more than the gain of the LNA, so the RF Amp actually receives less TX power than the LNA.

Another scenario, required for CDMA cellular band certification of the receiver's performance, is that where the CDMA signal is −90 dBm at the input to the receiver along with two jamming signals at −32 dBm each. The major stress on the receiver in this case is on the RF Amp's (and Mixer's) linearity, since the jammers are amplified by the LNA and not rejected by the filter (since they are in the desired RX band). The two-tone test is designed to test field conditions, such as those discussed above regarding unintentional jamming from competing cellular system.

It was mentioned that the RF Amp can be bypassed at a lower signal level since the LNA is engaged, however, there are other limitations on how low the bypass point can be. One such limitation has to do with the structure of the linearization used to accurately measure the RSSI. The lowest signal reported is typically −106 dBm (as seen by the AGC), and when an amplifier, or gain stage, is bypassed, if the signal reaches a level equivalent to −106 dBm, that amplifier is automatically engaged.

For example, if the gain is 15 dB, then a signal of −106+15=−91 dBm presents a signal at baseband equivalent to a −106 dBm signal with the stage engaged. The reason the stage must be engaged is because the signal level becomes unknown below −106 dBm, and could be too low to receive correctly unless the gain is present. Other factors, such as inaccuracies in calibration, and fluctuations in the RSSI reading effectively raise the minimum bypass point to approximately −88.5 dBm. If the RF Amp cannot be bypassed for the −90 dBm two-tone test, then the linearity requirement for the RF Amp is raised considerably. The raised linearity requirement is true both for the −90 dBm two-tone test and for field conditions because the −90 dBm two-tone test simulates actual field conditions.

Figure 2:
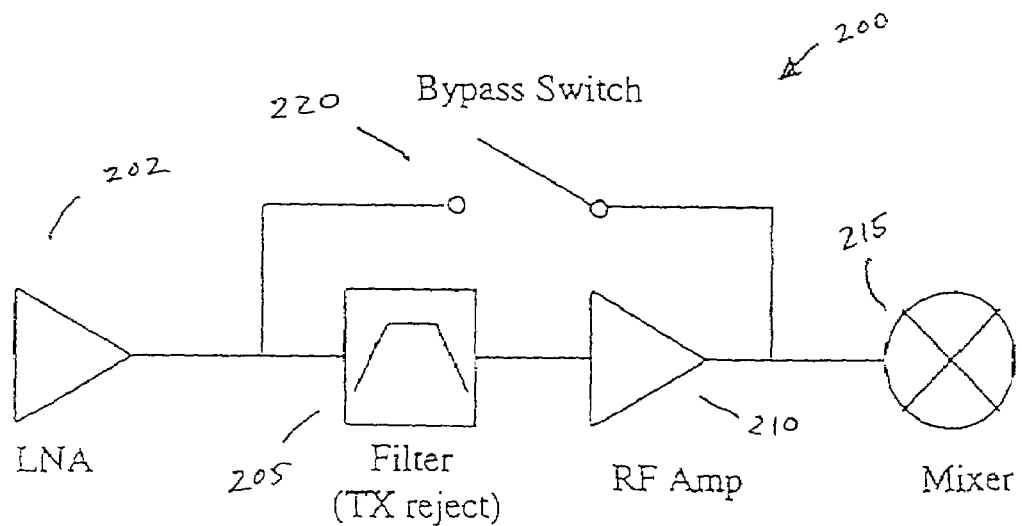
FIG. 2 is a block diagram of a receiver front end according to an embodiment of the present invention.

FIG. 2 represents a solution to this problem. FIG. 2 is a block diagram of a receiver front end 200 according to an embodiment of the present invention, including an LNA 202, Filter 205, RF amp 210, and mixer 215. The LNA 202 receives and amplifies RX signals which are then filtered and amplified before being passed on to the mixer. A bypass switch 220 provides a bypass where by the filter 205 and RF amplifier are bypassed, sending LNA amplified RX signals directly to the mixer 215. By bypassing the filter and RF Amp, the change in gain is lowered by the amount of attenuation caused by the filter 205. For example, the gain could be only 13 dB (15 dB−2 dB), which lowers the bypass point to −90.5 dBm such that the RF Amp can be bypassed for the −90 two-tone test and the linearity (and current consumption) requirements are also relaxed accordingly.

Figure 3A:
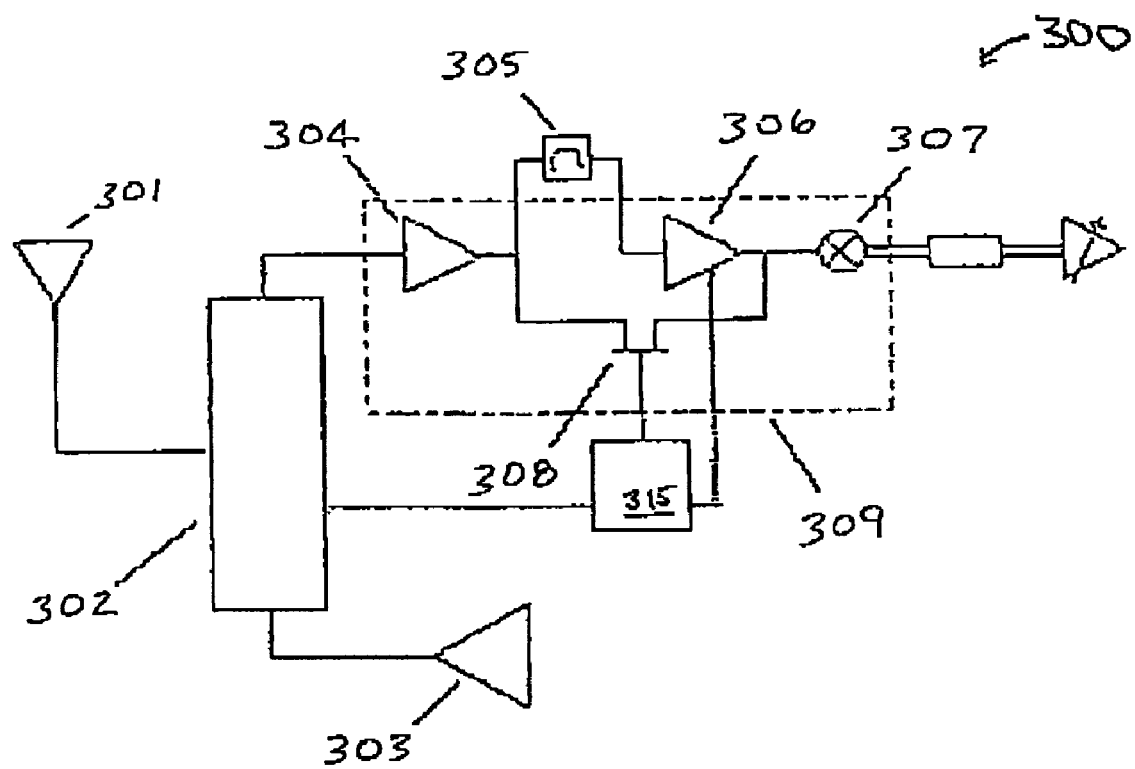
FIG. 3A is a block diagram of a receiver front end according to another embodiment of the present invention.

FIG. 3A is a block diagram of a transmitter and receiver device 300 having a front end according to another embodiment of the present invention. The transmitter and receiver device 300 includes an antenna 301, a duplexer 302, and a transmitter power amplifier 303. The transmitter power amplifier 103 is part of a transmitter part (not shown) that may exhibit the leakage discussed above that is rejected by the filter 305. A front end 309 of the receiver part includes an LNA 304, TX reject filter 305, RF amplifier 306, mixer 307, and bypass switch 308.

Signals received by the antenna 301 are transmitted through the duplexer 302, amplified by the LNA 304. If the signals amplified by the LNA 304 are strong enough to be utilized by the mixer and subsequent electronics, then a controller device 315 closes the bypass switch 308 so that the received and now amplified signals bypass the TX reject filter 305 and RF amplifier 306. The controller 315 also signals removes power applied to the RF amplifier. Removal of power from the power amplifier may be performed by the controller by sending a signal to disconnect the RF amplifier from the power supply or any other method that conserves the electrical power that would otherwise be provided to the RF amplifier.

Conversely, if the signals become too weak to be effectively utilized by the mixer and/or other subsequent electronics, the controller 315 keeps the bypass switch 308 open and the TX Reject Filter 305 and RF amplifier are utilized. If the RF amplifier was in a powered down (or bypassed) state, the bypass switch is opened and the RF amplifier 306 is powered up, otherwise the existing powered up state is maintained.

The received signal strength is transmitted to the controller 315 which compares the received signal strength to a threshold to identify whether the bypass switch should be open or closed and the RF amplifier powered up or powered down.

Figure 3B:
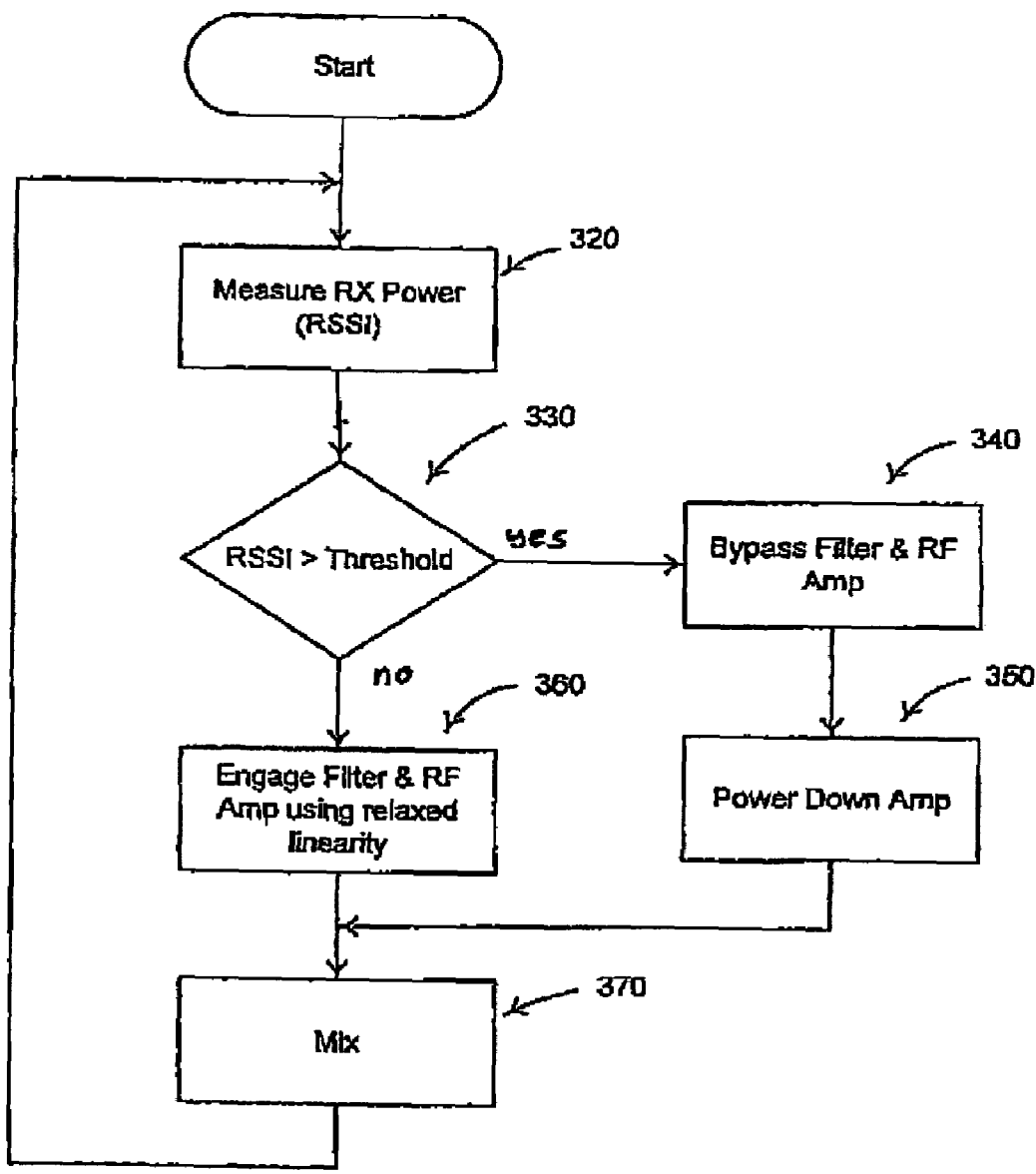
FIG. 3B is a flow chart illustrating a process that controls bypass switching according to an embodiment of the present invention.

FIG. 3B is a flow chart illustrating a process that controls bypass switching according to an embodiment of the present invention. At step 320, the power of a received signal is measured. The received power may be determined from any source that indicates the signal strength (RSSI) the RSSI can be measured using a diode transistor, FET, or a circuit, such as a log amp which can be implemented to determine signal levels. If the RSSI is greater than a predetermined threshold or bypass point, then, at step 340, the filter (e.g., TX Reject Filter 305) and RF amplifier (e.g., RF Amplifier 306), and the RF amplifier is powered down (step 350). If prior to step 340, the Filter and RF amplifier are already bypassed and powered down, they remain in the bypassed and powered down state.

In step 330, if the RSSI is less than the predetermined threshold or bypass point, at step 360, the filter and RF amp are engaged, and the RF amplifier is powered up. If prior to step 360, the Filter and RF amplifier are already engaged and powered up, they remain in the engaged and powered up state until the RSSI increases above the threshold and steps 340 and 350 are performed.

In one embodiment, if the Filter and RF amplifier are bypassed and the RF amplifier is powered down, the bypassed and powered down state remains until the RSSI drops below the threshold or bypass point. In another embodiment, the powered down state is maintained until either the RSSI drops below the threshold or a time out occurs.

The threshold is preferably a fixed threshold calculated as discussed above. However, a threshold exhibiting hysteresis may also be utilized, or, a floating threshold may be calculated based on factors affect the best value for the threshold. Factors for affecting a threshold value are, for example, an amount of error in calculating the RSSI, environmental conditions, including temperature variations, variations in the insertion-loss frequency in the filters, calibration of the linearizer, or a magnitude of the RSSI itself.

At some RSSI levels, the use of the LNA is not needed. In these cases, even without LNA amplification, the received signals are strong enough to be used by the mixer in step 370 and subsequent electronics (e.g., IF filter, AGC, etc.) without further amplification. A by-pass circuit similar to bypass switch 220 is then implemented around the LNA. Various configuration of LNA bypass circuits may be found in the above referenced patent, and those configurations may be incorporated with the RF amp & filter bypass of the present invention. By using an LNA bypass circuit in conjunction with the filter and RF amplifier bypass device, further reductions in power consumption are achieved.

Figure 4A:
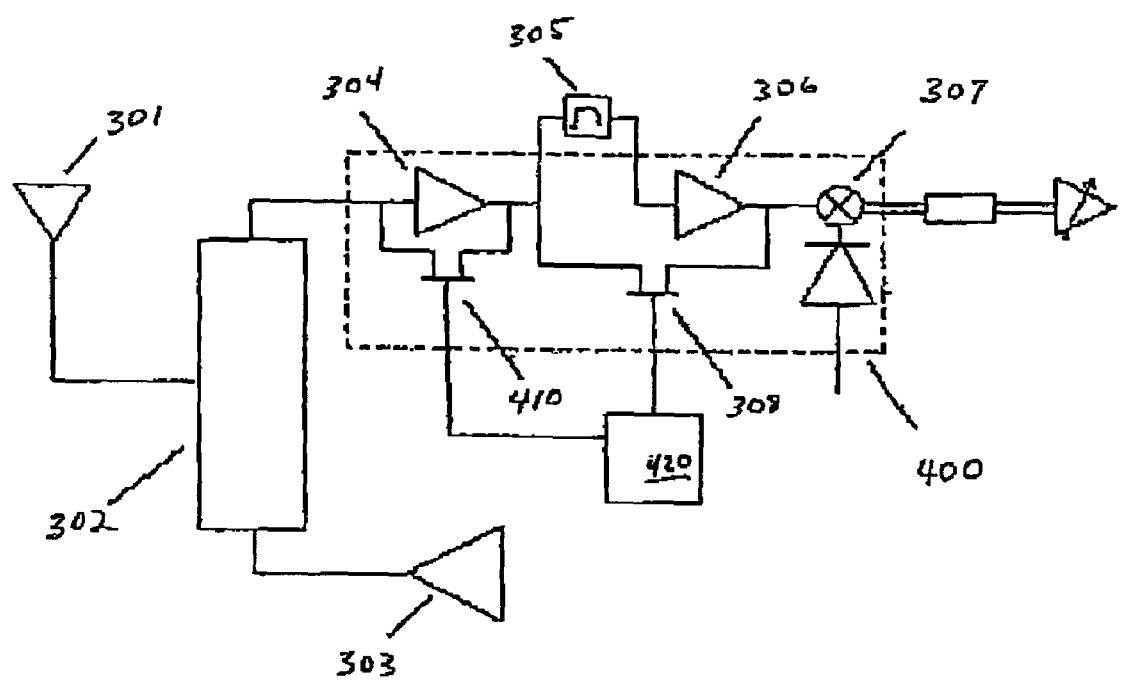
FIG. 4A is a block diagram of a receiver front end according to yet another embodiment of the present invention.

FIG. 4A provides an example of a circuit according to the present invention also incorporating LNA bypass circuitry. A front end device 400 includes an LNA 304 and bypass circuitry 410. A processing device 420 is programmed to recognize threshold RSSI/RSS values for bypassing either the RF anplifier 306 and filter 305 individually or in combination with a bypass of the LNA 304. If the first threshold is passed, the RF amplifier and filter are bypassed. If the signal strength increases beyond a second threshold, the LNA is bypassed. Processing device 420 recognizes the threshold crossings and sends appropriate control signals to the corresponding bypass circuitry. In one embodiment, the second threshold is higher than the first threshold. In another embodiment, the second bypass circuit is activated if an RSSI of a received signal is greater than a first threshold, and the first bypass circuit is activated if the RSSI exceeds a second threshold higher than the first threshold.

Figure 4B:
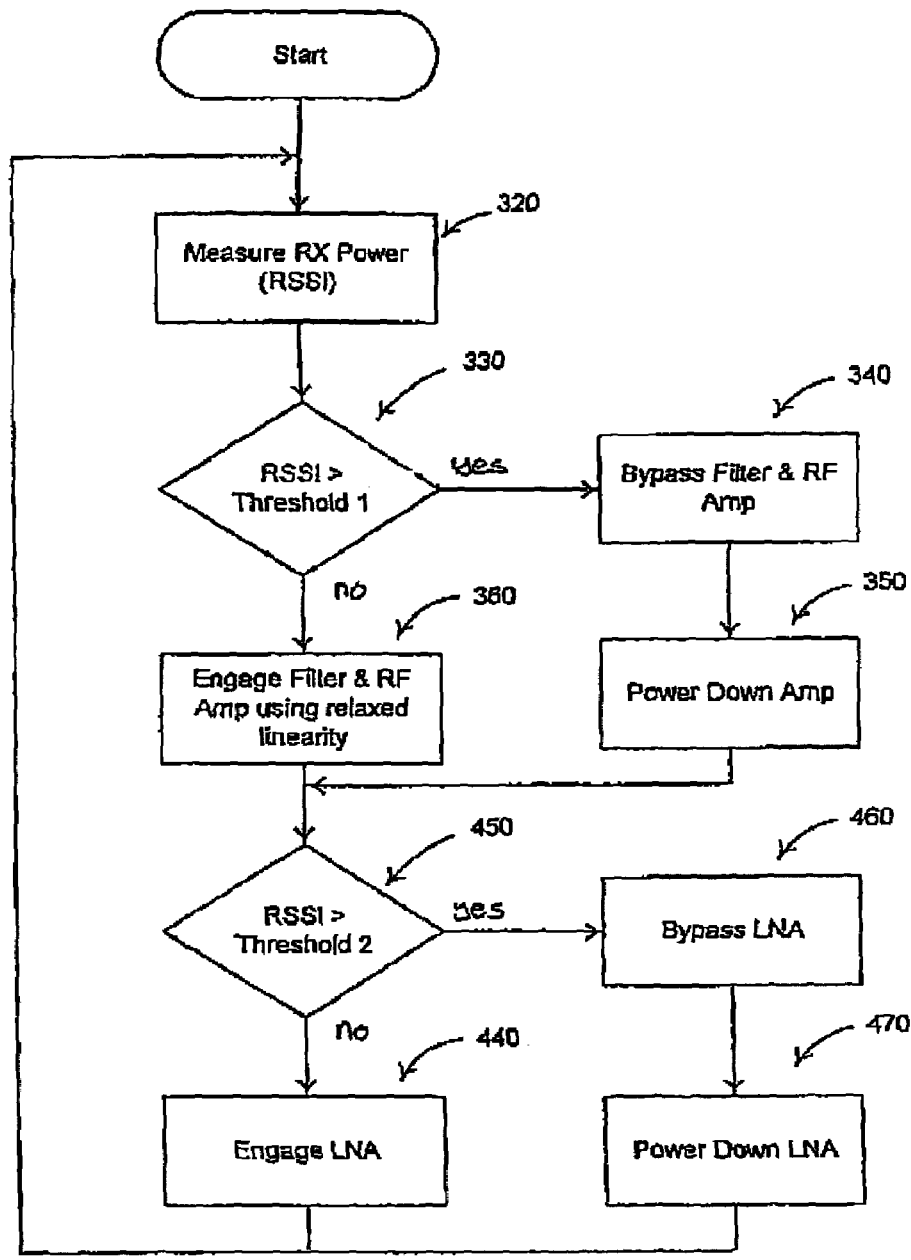
FIG. 4B is a flow chart illustrating a process that controls bypass switching according to an embodiment of the present invention.

FIG. 4B is a flow chart of an embodiment of a program flow for implementing both LNA and RF amplifier and filter bypass circuitry. At step 450 the RSSI is compared against the second threshold, if the RSSI is greater than the second threshold, the LNA is bypassed (step 460) and the LNA is powered down (step 470).

If the LNA was powered down, and the RSSI is less than the second threshold, the LNA is powered up (step 440). Under these same conditions, if the LNA was already engaged, it remains engaged.

FIG. 4B provides one example of a program flow implementing the present invention. Other flows are clearly applicable based on the present disclosure. For example, the order of checking thresholds may be varied, or the ranges may be altered (For example, the RSSI may be tested to be within a specific range rather than test for above a threshold).

Table 1 illustrates a probability distribution function (pdf) and current use for typical field conditions. The pdf represents a distribution of an expected amount of RX power when actually using a communications device.

TABLE 1

| RX | pdf | 421 | current | 6.396675 |
|---|---|---|---|---|
| −106 | 0.009501 | 4 | 21 | 0.199525 |
| −103.5 | 0.007126 | 3 | 21 | 0.149644 |
| −101 | 0.011876 | 5 | 21 | 0.249406 |
| −98.5 | 0.016627 | 7 | 21 | 0.349169 |
| −96 | 0.021378 | 9 | 21 | 0.448931 |
| −93.5 | 0.028504 | 12 | 21 | 0.598575 |
| −91 | 0.033254 | 14 | 13 | 0.432304 |
| −88.5 | 0.04038 | 17 | 13 | 0.524941 |
| −86 | 0.045131 | 19 | 13 | 0.586698 |
| −83.5 | 0.049881 | 21 | 13 | 0.648456 |
| −81 | 0.054632 | 23 | 3 | 0.163895 |
| −78.5 | 0.057007 | 24 | 3 | 0.171021 |
| −76 | 0.059382 | 25 | 3 | 0.178147 |
| −73.5 | 0.059382 | 25 | 3 | 0.178147 |
| −71 | 0.054632 | 23 | 3 | 0.163895 |
| −68.5 | 0.052257 | 22 | 3 | 0.15677 |
| −66 | 0.047506 | 20 | 3 | 0.142518 |
| −63.5 | 0.042755 | 18 | 3 | 0.128266 |
| −61 | 0.04038 | 17 | 3 | 0.12114 |
| −58.5 | 0.038005 | 16 | 3 | 0.114014 |
| −56 | 0.033254 | 14 | 3 | 0.099762 |
| −53.5 | 0.030879 | 13 | 3 | 0.092637 |
| −51 | 0.028504 | 12 | 3 | 0.085511 |
| −48.5 | 0.026128 | 11 | 3 | 0.078385 |
| −46 | 0.021378 | 9 | 3 | 0.064133 |
| −43.5 | 0.019002 | 8 | 3 | 0.057007 |
| −41 | 0.016627 | 7 | 3 | 0.049881 |
| −38.5 | 0.014252 | 6 | 3 | 0.042755 |
| −36 | 0.011876 | 5 | 3 | 0.035629 |
| −33.5 | 0.009501 | 4 | 3 | 0.028504 |
| −31 | 0.007126 | 3 | 3 | 0.021378 |
| −28.5 | 0.004751 | 2 | 3 | 0.014252 |
| −26 | 0.004751 | 2 | 3 | 0.014252 |
| −23.5 | 0.002375 | 1 | 3 | 0.007126 |
| −21 | 0 | 0 | 3 | 0 |

Figure 5:
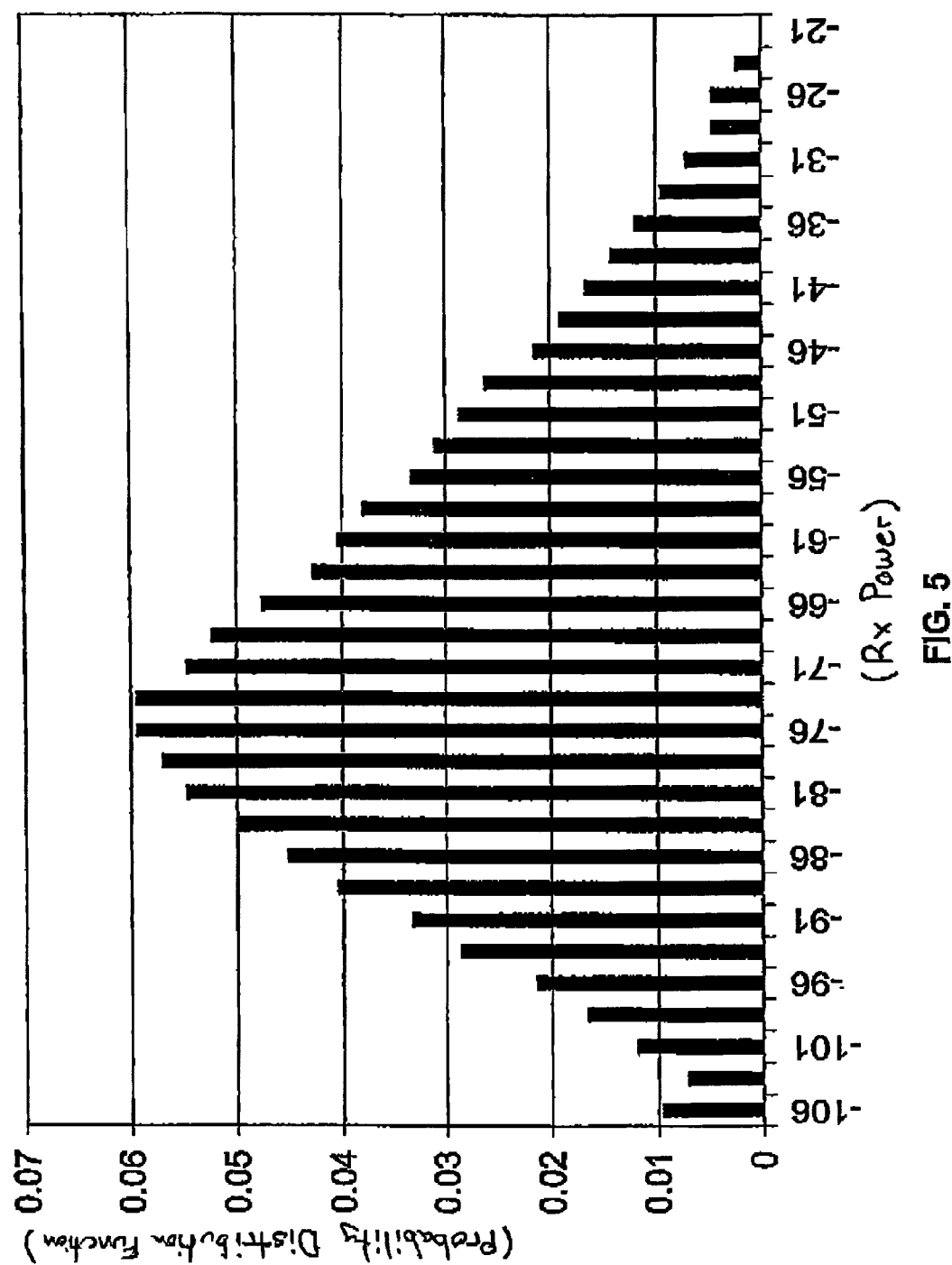
FIG. 5 is a chart illustrating a probability distribution of expected RX input power under field conditions.

The pdf is illustrated graphically in FIG. 5. As can be seen in the pdf graph, roughly 6.5% of the received (RX) signals fall into a category that requires full amplification using both the LNA and RF amplifier (approximately all signals received in the −106 to −96 dBm range). Another 15% or so of the RX signals fall into a category in which the RF amplifier and TX Reject Filter may be bypassed. And, the remaining signals fall into a category in which neither the RF amplifier/Filter and/or the LNA are needed to boost signal strength.

Figure 6:
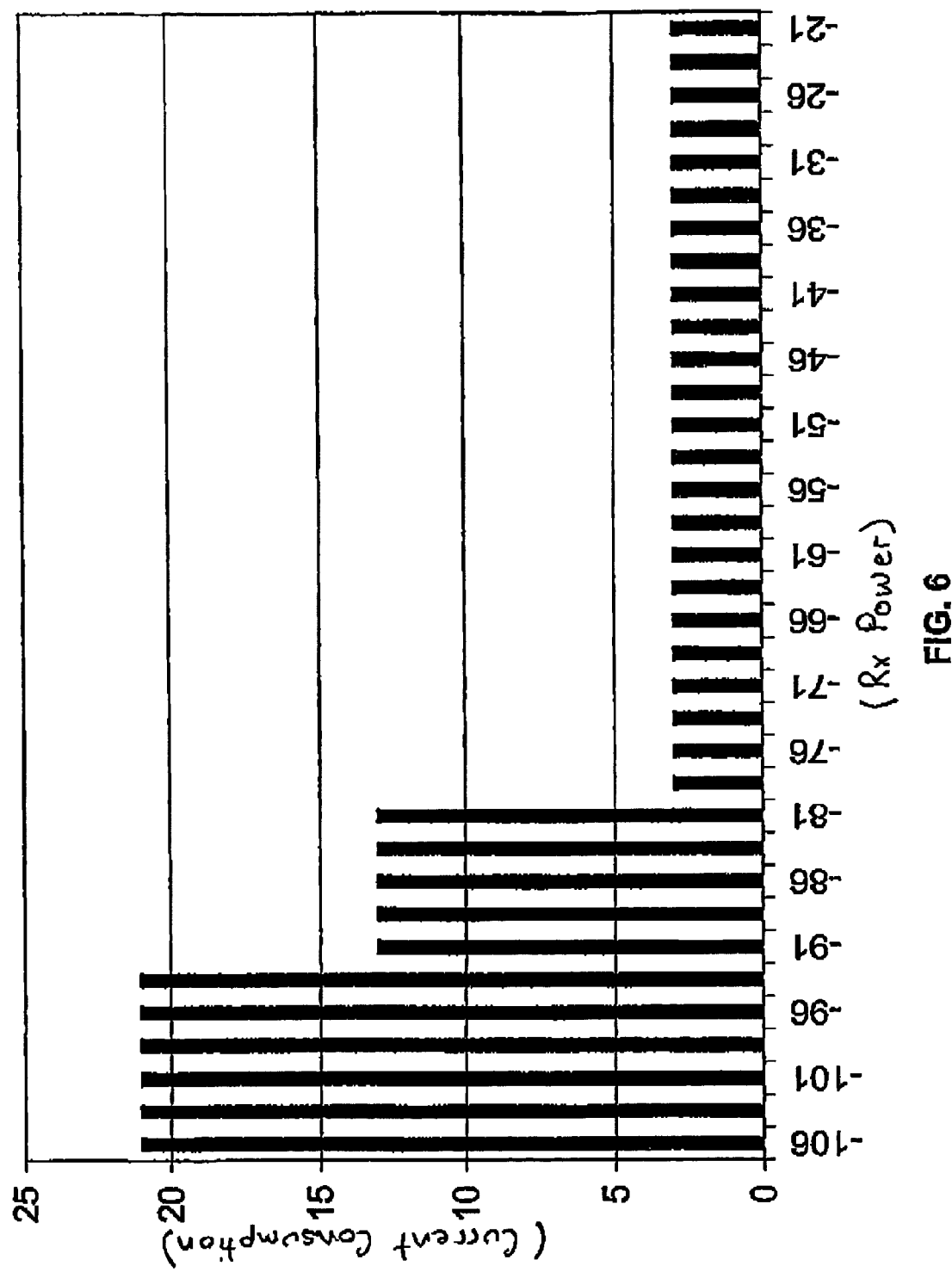
FIG. 6 is a chart illustrating current consumption of an embodiment of an RX front-end vs. input power according to the present invention.

FIG. 6 is a chart illustrating current consumption of an embodiment of an RX front-end vs. input power according to the present invention. The current consumption follows the categories of RX power as they relate to the amount of amplification required according to the strength of the RX signal (plus other electric power consumption inherent in the circuit elements). For example, in the category that requires full amplification (both LNA and RF amp), the current consumption is approximately 21 mA. The category that no longer requires the RF amplifier (RF amp bypassed and off) uses approximately 13 mA. And finally, the category in which both the LNA and RF amp are not required (LNA bypassed and off, RF amp bypassed and off, LO remaining (315), shown in FIG. 4A) uses approximately 3 mA. The current consumption provided in FIG. 6 and pdf of FIG. 5 are provided for exemplary purposes.

As discussed above, in bypassing both the filter and RF amplifier, the present invention has a lowered switch point for bypassing the filter and RF amplifier. This lower bypass results in lower power consumption for the amount of time in which RX signals are received between the lowered bypass point and the previous bypass point (the previous bypass point being calculated for bypassing the RF amplifier only).

Figure 7:
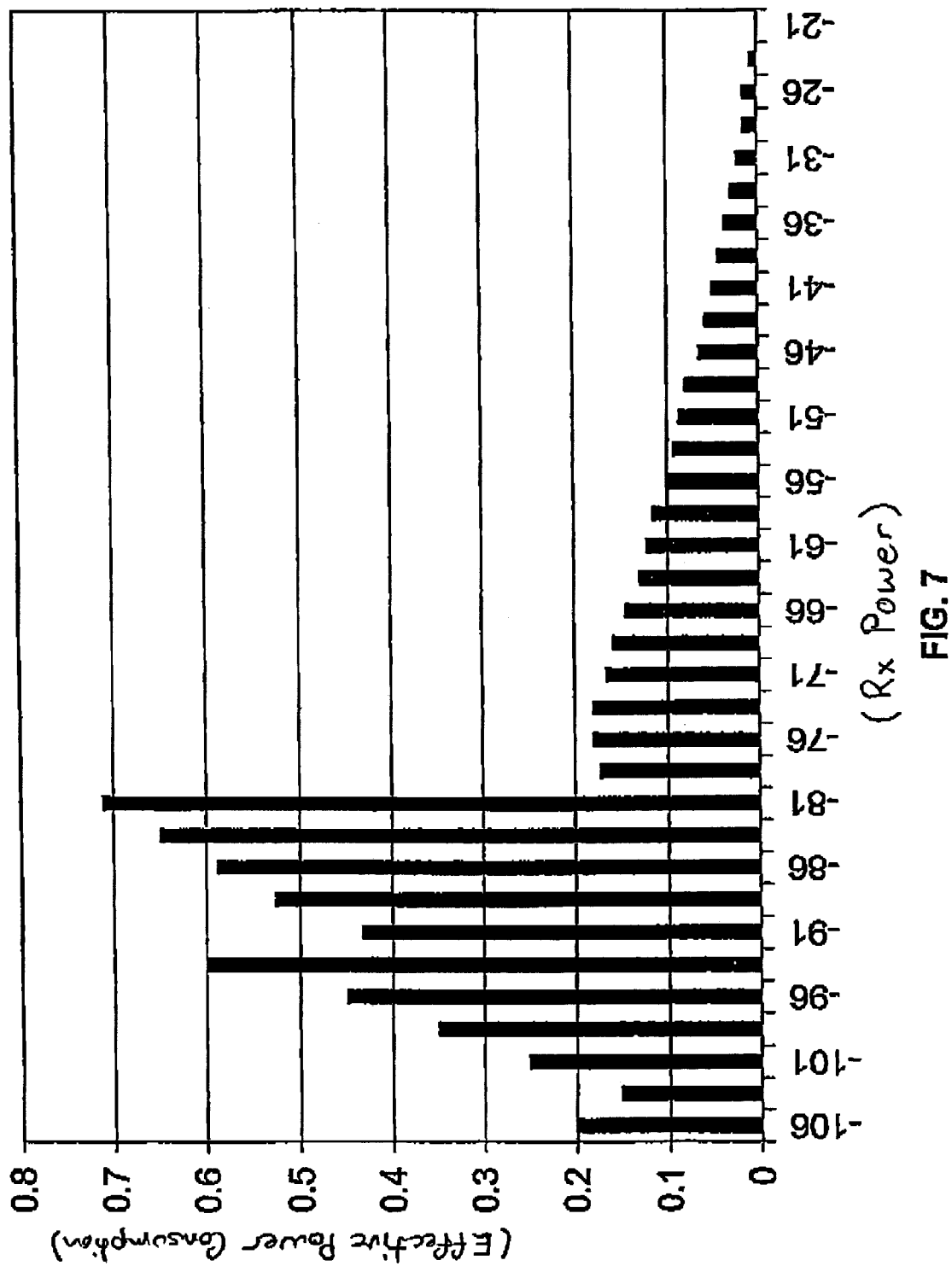
FIG. 7 is a chart of a product of the data illustrated in FIGS. 5 and 6, which shows effective contribution at each RX input power.

FIG. 7 is a the current consumption illustrated in FIG. 6 multiplied with the probability distribution of FIG. 5. FIG. 7 provides an effective amount of power consumption at each RX power level. FIG. 7 illustrates savings in the range of −91 dBm to approximately −83 dBm. In that range, a typical front has not yet reached a threshold to bypasses the RF amp. However, the present invention, with a lower bypass point, has already bypassed and turned off the RF amp. The active mixer still draws 12.15 mA including an LO buffer with a passive mixer.

One problem that appears to be apparent with the concept of bypassing the filter is that now a stronger TX signal can reach the mixer, but closer examination reveals that this is not a problem. The TX signal presented to the mixer would result due to leakage from an associated transmitter which would no longer be rejected at the filter. However, the TX level tracks the receive signal by the so called turn-around equation. The turn-around equation is a formula for calculating transmission strength for a transmitter associated with the RX signals received. The turn around equation is formulated to make sure that transmission power is higher when RX signals are weak and transmission power is low when RX signals are strong, and thereby keep transmission power low on shared communications channels.

For the cellular band, the turn-around equation is:

$$TX+RX=-73\ dB$$

Therefore, if the RSSI is −90 dBm, the TX power is about +17 dBm. The effective change in gain for the TX energy is approximately the RF Amp's gain minus the filter rejection, which is about 15−22=+7 dBm.

Another reference point is the −101 dBm CDMA two-tone test with jammers at −43 dBm. In this case the TX power is typically limited to about +23.5 dBm, or 6.5 dBm higher than the TX level at the −90 dBm two-tone test. The jammer level difference is more that offset by bypassing the RF Amp. For example, −32 dBm −13 dBm=−45 dBm jammer level compared with −43 dBm. The TX power is just a little higher for the −90 dBm two-tone test . . . +7−6.5=0.5 dB, so the −101 dBm two-tone test still represents the more stringent requirement on the mixer than bypassing the TX reject filter with the RF Amp. In this example, the difference was that the −101 dBm two-tone test had 2 dB more jammer power but only 0.5 dB less TX power.

In summary, by bypassing the filter with the RF Amp as shown in FIG. 2, the bypass switch point can be placed −90 dBm or less, thereby relaxing the linearity requirements for the RF Amp (and the mixer). The same idea can be applied to a PCS CDMA receiver, or a CDMA receiver in any band. Another benefit is that by lowering the switch point, more current can be saved more often, but switching off the supply of the bypassed amplifier when not in use, since the probability that the RSSI will be greater than the bypass switch point is increased. The switching methodology, a Single Pole Single Throw (SPST), presented is just for example, and a Single Pole Double Throw (SPDT) can be used, or any other switching methodology, to address issues such as matching or combining architecture elements in different ways.

Figure 8A:
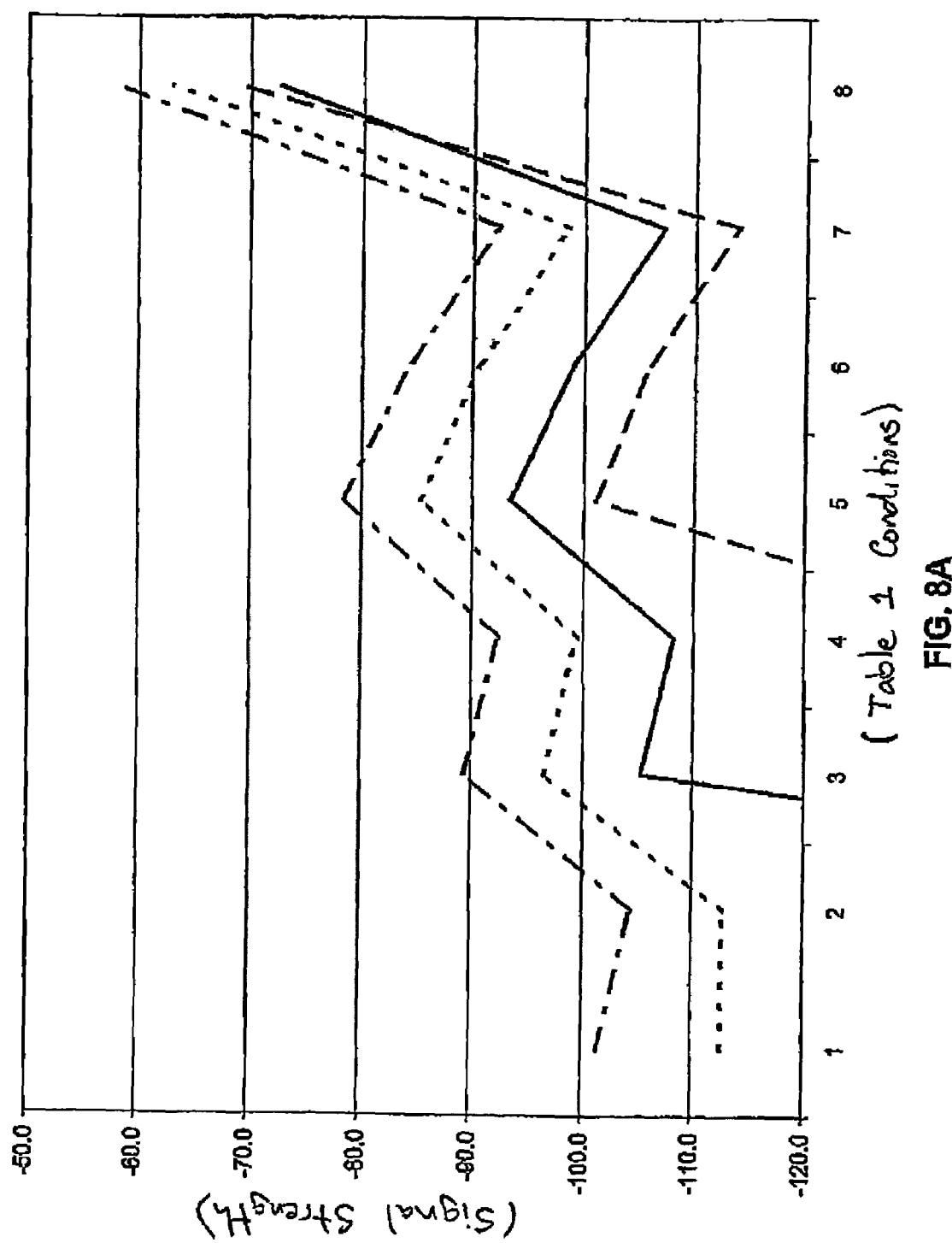
FIG. 8A is a graph of a CDMA −101 dBm, −43 dBm two tone test with a front end according to the present invention with all stages engaged.

FIGS. 8A–8D illustrate graph of signal strengths for each of the running signal (RS—mixed dashed line); run in-band noise (IBN—short dashed line); Running X-mod Out (RX—solid line); and Running IM Out (RIM—long dashed line) signals for various test configurations. FIG. 8A is a graph of a CDMA −101 dBm, −43 dBm two tone test, as numerically illustrated in table 2A.

TABLE 2A

| RS  | −101.4 | −104.4 | −89.4  | −92.4  | −78.4  | −84.4  | −92.4  | −58.1 |
| --- | ------ | ------ | ------ | ------ | ------ | ------ | ------ | ----- |
| IBN | −112.6 | −112.7 | −96.6  | −99.6  | −85.3  | −90.7  | −98.6  | −63.2 |
| RX  | −194.5 | −197.5 | −105.3 | −108.3 | −93.4  | −99.2  | −107.2 | −72.7 |
| RIM | −329.4 | −329.0 | −140.2 | −143.2 | −101.1 | −105.9 | −113.9 | −69.3 |

Figure 8B:
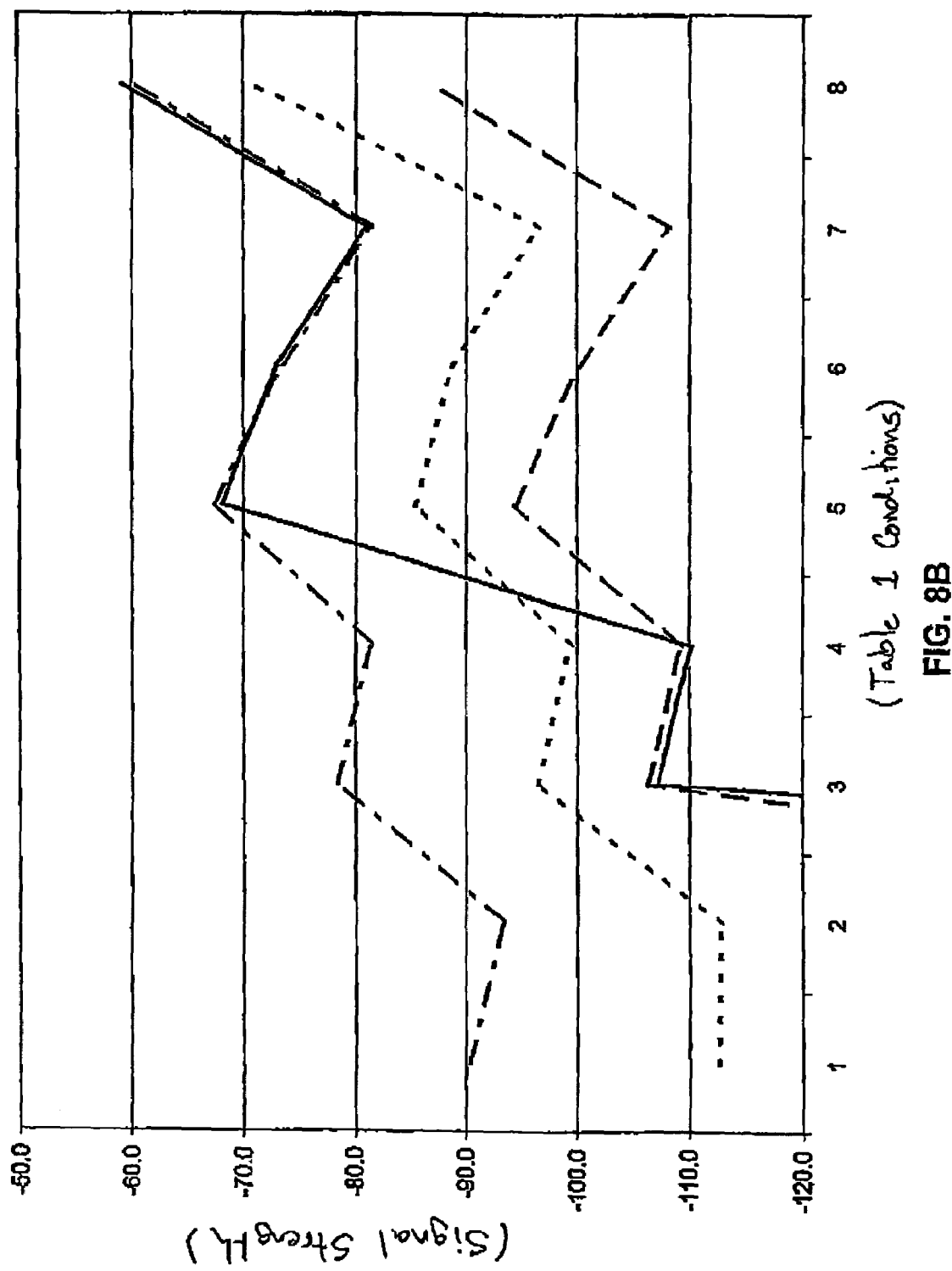
FIG. 8B is a graph of a CDMA −90 dBm, −32 dBm two tone test with a front end according to the present invention with all stages engaged.

FIG. 8B is a graph of a CDMA −90 dBm, −32 dBm two tone test with a front end according to the present invention with all stages engaged, as numerically illustrated in Table 2B.

TABLE 2B

| RS   | −90.4  | −93.4  | −78.4  | −81.4  | −67.4  | −73.4  | −81.4  | −60.3 |
| ---- | ------ | ------ | ------ | ------ | ------ | ------ | ------ | ----- |
| IBN: | −112.6 | −112.7 | −96.6  | −99.5  | −85.3  | −88.6  | −96.6  | −71.0 |
| RX   | −195.5 | −198.5 | −106.3 | −109.3 | −94.4  | −100.2 | −108.2 | −87.1 |
| RIM  | −296.4 | −296.0 | −107.2 | −110.2 | −68.1  | −72.9  | −80.9  | −59.2 |

Figure 8C:
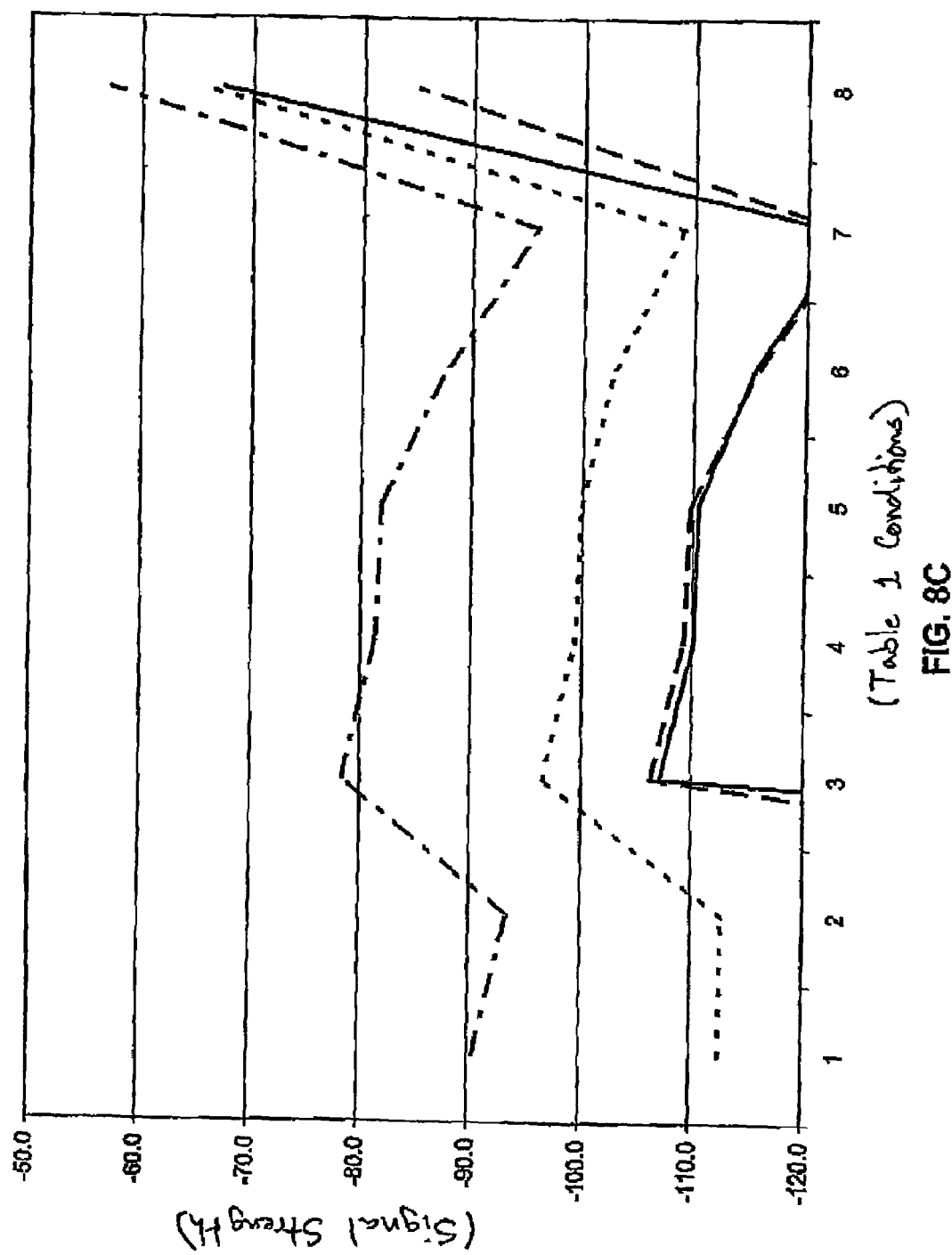
FIG. 8C is a graph of a CDMA −90 dBm, −32 dBm two tone test with a front end according to the present invention with the RF Amp bypassed.

FIG. 8C is a graph of a CDMA −90 dBm, −32 dBm two tone test with a front end according to the present invention with the RF Amp bypassed, as numerically illustrated in Table 2C.

TABLE 2C

| RS  | −90.4  | −93.4  | −78.4  | −81.4  | −81.9  | −87.9  | −95.9  | −57.2 |
| --- | ------ | ------ | ------ | ------ | ------ | ------ | ------ | ----- |
| IBN | −112.6 | −112.7 | −96.6  | −99.5  | −99.9  | −102.9 | −109.0 | −65.6 |
| RX  | −195.5 | −198.5 | −106.3 | −109.3 | −109.8 | −115.8 | −123.8 | −85.1 |
| RIM | −296.4 | −296.0 | −107.2 | −110.2 | −110.5 | −115.5 | −123.5 | −67.3 |

Figure 8D:
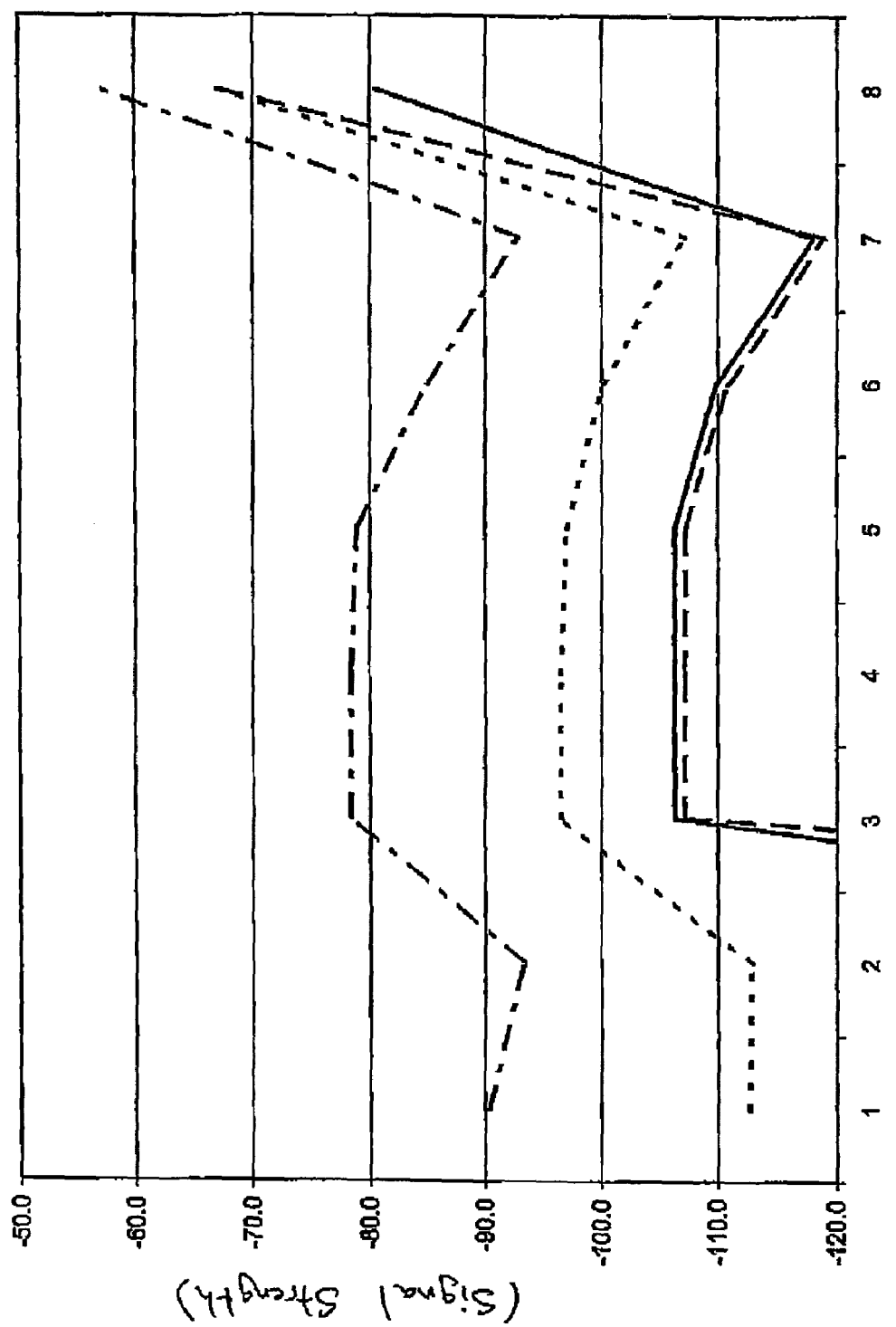
FIG. 8D is a graph of a CDMA −90 dBm, −32 dBm two tone test with a front end according to the present invention with the filter and RF Amp bypassed.

And, FIG. 8D is a graph of a CDMA −90 dBm, −32 dBm two tone test with a front end according to the present invention with the filter and RF Amp bypassed, as numerically illustrated in Table 2D.

TABLE 2D

| RS  | −90.4  | −93.4  | −78.4  | −78.4  | −78.9  | −84.9  | −92.9  | −57.2 |
| --- | ------ | ------ | ------ | ------ | ------ | ------ | ------ | ----- |
| IBN | −112.6 | −112.7 | −96.6  | −96.6  | −97.1  | −100.2 | −107.1 | −67.0 |
| RX  | −195.5 | −198.5 | −106.3 | −106.3 | −106.3 | −110.0 | −118.0 | −80.5 |
| RIM | −296.4 | −296.0 | −107.2 | −107.2 | −107.2 | −110.9 | −118.9 | −67.3 |

Although the present invention has been mainly described in terms of CDMA receiver/transmitted such as that used in mobile telephone devices, the various aspects of the invention may be practiced on any device that requires linearity in an electronic circuit that utilizes an amplifier and filter combination.

Portions of the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

The present invention includes a computer program product which is a storage medium (media) having instructions stored thereon/in which can be used to control, or cause, a computer to perform any of the processes of the present invention. The storage medium can include, but is not limited to, any type of disk including floppy disks, mini disks (MD's), optical discs, DVD, CD-ROMS, micro-drive, and magneto-optical disks, ROMs, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software for performing the present invention, as described above.

Included in the programming (software) of the general/specialized computer or microprocessor are software modules for implementing the teachings of the present invention, including, but not limited to, identification and/or retrieval of received signal strength (RSS/RSSI), comparing RSS/RSSI to thresholds, activating bypass switches, and the display, storage, or communication of results according to the processes of the present invention.

Obviously, numerous modifications and variations of the present invention are possible in light of the above teachings. It is therefore to be understood that within the scope of the appended claims, the invention may be practiced otherwise than as specifically described herein.

What is claimed:

1. A method of reducing power requirement of a front end device in a receiver, comprising the steps of:
   measuring a received signal strength (RSS) of a signal received at an antenna;
   comparing the received signal strength to a predetermined threshold; and
   bypassing a filter and an amplifier in the front end if the received signal strength is greater than said predetermined threshold;
   wherein said front end comprises:
      a Low Noise Amplifier (LNA) having an LNA input coupled to a signal source and an LNA output,
      a filter having an input coupled to the LNA output and a filter output,
      an amplifier having an amplifier input coupled to the filter output and an amplifier output, and
      a bypass circuit comprising a bypass switch coupled between the input of the filter and the amplifier output;
   wherein said step of bypassing comprises closing the bypass switch;
   wherein said predetermined threshold point comprises a minimum recognizable signal strength plus an amount of power representing error in RSS measurement and signal strength losses less an amount of amplification of the LNA.

2. The method according to claim 1, wherein said predetermined threshold is −90.5 dBm.

3. The method according to claim 1, wherein electronics coupled to an output of said front end require a minimum signal strength in order to process the signal received at the antenna, and wherein said predetermined threshold comprises said minimum signal strength less a strength of amplification by a Low Noise Amplifier (LNA) of said front end.

4. The method according to claim 1, further comprising the step of:
   powering down said amplifier if the amplifier is powered up and the received signal strength is greater than said threshold.

5. The method according to claim 1, wherein said minimum recognizable signal strength is a weakest signal capable of being processed by electronics couple to said mixer output.

6. The method according to claim 1, wherein said minimum recognizable signal strength is −106 dBm.

7. The method according to claim 1, wherein:
   said method is embodied in a set of computer instructions stored on a computer readable media;
   said computer instructions, when loaded into a computer, cause the computer to perform the steps of said method.

8. The method according to claim 7, wherein said set of computer instruction are compiled computer instructions stored as an executable program on said computer readable media.

9. The method according to claim 1, wherein said method is embodied in a set of computer readable instructions stored in an electronic signal.

10. A front end architecture, comprising:
    a Low Noise Amplifier (LNA) having an LNA input and an LNA output, said LNA input coupled to a signal source; wherein the signal source corresponds to a signal received at an antenna;
    a filter having an input coupled to the LNA output and a filter output;
    an radio frequency (RF) amplifier having an RF amplifier input coupled to the filter output and an RF amplifier output;
    a first bypass circuit coupled between the input of the filter and the RF amplifier output and configured to bypass the filter and RF amplifier;
    a control device configured to activate and deactivate the first bypass circuit; and
    a second bypass circuit coupled between the LNA input and the LNA output;
    wherein said control circuit is further configured to activate and deactivate the second bypass circuit;
    wherein the second bypass circuit is activated if the received signal strength (RSS) of a received signal is greater than a first threshold, and the first bypass circuit is activated if the received signal strength (RSS) exceeds a second threshold higher than the first threshold.

11. The front end according to claim 10, wherein the first bypass circuit comprises a switch coupled between the input of the filter and the radio frequency (RF) amplifier output.

12. The front end according to claim 11, wherein said switch is a Single Pole Single Throw.

13. The front end according to claim 11, wherein said switch is a transistor.

14. The front end according to claim 10, further comprising:
    a signal detector coupled to said signal source and configured to determine a received signal strength (RSS) of a signal from said signal source;
    wherein said control device is further configured to activate and deactivate the first bypass circuit according to the RSS of the signal from said signal source.

15. The front end architecture according to claim 10, wherein the first bypass circuit is activated if a recieved signal strength (RSS) of a received signal is greater than a first threshold, and the second bypass circuit is activated if the RSSI exceeds a second threshold.

16. The front end device according to claim 15, wherein the second threshold is higher than the first threshold.

17. A front end device, comprising:
    means for measuring a received signal strength (RSS) of a signal received at an antenna;
    means for comparing the received signal strength to a first predetermined threshold;
    means for bypassing a filter and an amplifier in the front end if the received signal strength is greater than said first predetermined threshold; and
    means for bypassing a low noise amplifier if the received signal strength exceeds a second predetermined threshold that is higher than the first predetermined threshold.

18. The front end device according to claim 17, wherein said means for comparing comprises:
    a computing means coupled to said means for measuring and said means for bypassing.

19. The front end according to claim 17, further comprising:
    a means for low noise amplification (LNA) coupled to a signal source;
    a filter means coupled to an output of the LNA; and
    an amplifier means coupled to an output of the filter means;
    wherein said means for bypassing is coupled to an input of the filter means and an output of the amplifier means.

* * * * *

UNITED STATES PATENT AND TRADEMARK OFFICE
CERTIFICATE OF CORRECTION

| | | |
|---|---|---|
| PATENT NO. | : 7,061,993 B2 | |
| APPLICATION NO. | : 09/942360 | |
| DATED | : June 13, 2006 | |
| INVENTOR(S) | : Wieck | |

It is certified that error appears in the above-identified patent and that said Letters Patent is hereby corrected as shown below:

On the TITLE PAGE (56):

Under FOREIGN PATENT DOCUMENTS, column 2, line 1, after "11/1990" insert --H04B 01/06--.

In the CLAIMS:

Claim 5, column 11, line 49, delete "couple to said" and insert --coupled to a--.

Claim 7, column 11, line 56, after "said" insert --set of--.

Claim 8, column 11, line 59, delete "instruction" and insert --instructions--.

Claim 10, column 12, line 1, delete "source;" and insert --source,--.

Claim 15, column 12, line 37, delete "recieved" and insert --received--.

Claim 19, column 12, line 59, delete "low noise amplification" and insert --Low Noise Amplifier--.

Signed and Sealed this

Tenth Day of April, 2007

JON W. DUDAS
*Director of the United States Patent and Trademark Office*